(12) United States Patent
Casado et al.

(10) Patent No.: US 9,071,281 B2
(45) Date of Patent: Jun. 30, 2015

(54) SELECTIVE PROVISION OF ERROR CORRECTION FOR MEMORY

(71) Applicant: Intel Corporation, Santa Clara, CA (US)

(72) Inventors: Javier Carretero Casado, Barcelona (ES); Xavier Vera, Barcelona (ES); Daniel Sanchez, L'Hospitalet de Llobregat (ES); Tanausu Ramirez, Barcelona (ES); Enric Herrero Abellanas, Cardedeu (ES); Nicholas Axelos, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 13/792,117

(22) Filed: Mar. 10, 2013

(65) Prior Publication Data
US 2014/0258805 A1   Sep. 11, 2014

(51) Int. Cl.
*H03M 13/00* (2006.01)
*H03M 13/35* (2006.01)

(52) U.S. Cl.
CPC .................................... *H03M 13/35* (2013.01)

(58) Field of Classification Search
CPC .. H03M 13/09; H03M 13/091; H04L 1/0061; H04L 1/0057; H04L 1/0045
USPC ........................................................ 714/758
See application file for complete search history.

(56) References Cited

U.S. PATENT DOCUMENTS

| | | | | |
|---|---|---|---|---|
| 4,703,485 A | * | 10/1987 | Patel | 714/779 |
| 5,734,663 A | * | 3/1998 | Eggenberger | 714/762 |
| 2008/0313493 A1 | * | 12/2008 | Roohparvar et al. | 714/6 |
| 2012/0284587 A1 | * | 11/2012 | Yu et al. | 714/773 |
| 2013/0297894 A1 | * | 11/2013 | Cohen et al. | 711/154 |
| 2013/0318418 A1 | * | 11/2013 | Bedeschi et al. | 714/758 |

* cited by examiner

*Primary Examiner* — Albert Decady
*Assistant Examiner* — Enam Ahmed
(74) *Attorney, Agent, or Firm* — Schwabe, Williamson & Wyatt, P.C.

(57) ABSTRACT

Embodiments of apparatuses, methods, and storage medium associated with selectively providing error correction to memory are disclosed herein. In one instance, an apparatus may include a memory controller configured to control access to a non-volatile memory having storage locations. The controller may be configured to provide a first error correction arrangement to provide a first level of error correction capability for data stored in the non-volatile memory. The memory controller may include a control/error correction block configured to provide a second error correction arrangement with a second level of error correction capability for data stored in the non-volatile memory. The second level of error correction capability enables correction of at least one bit error more than the first level. The memory controller may be configured to selectively employ the second error correction arrangement to complement the first error correction arrangement. Other embodiments may be described and claimed.

23 Claims, 6 Drawing Sheets

SELECTIVE PROVISION OF ERROR CORRECTION FOR MEMORY

FIELD

Embodiments of the present disclosure generally relate to the field of data processing, and more particularly, to techniques for selectively providing error correction for a non-volatile memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Nowadays, errors occurring in a device's memory may be the biggest contributor to device crashes, hangs and/or data corruption. Memory integrity protection solutions, such as Reliability, Availability, and Serviceability (RAS) technologies have been developed to help bring the device memory vulnerability down to an almost negligible level. These measures include techniques aimed at predicting and correcting, when possible, multi-bit errors occurring in memory due to hard faults, wear-out, and the like. However, these solutions may typically require massive investments of resources necessary to provide adequate performance and power. Accordingly, such solutions may be mainly employed for mission-critical devices, e.g., high end servers for cloud computing, due to their high costs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
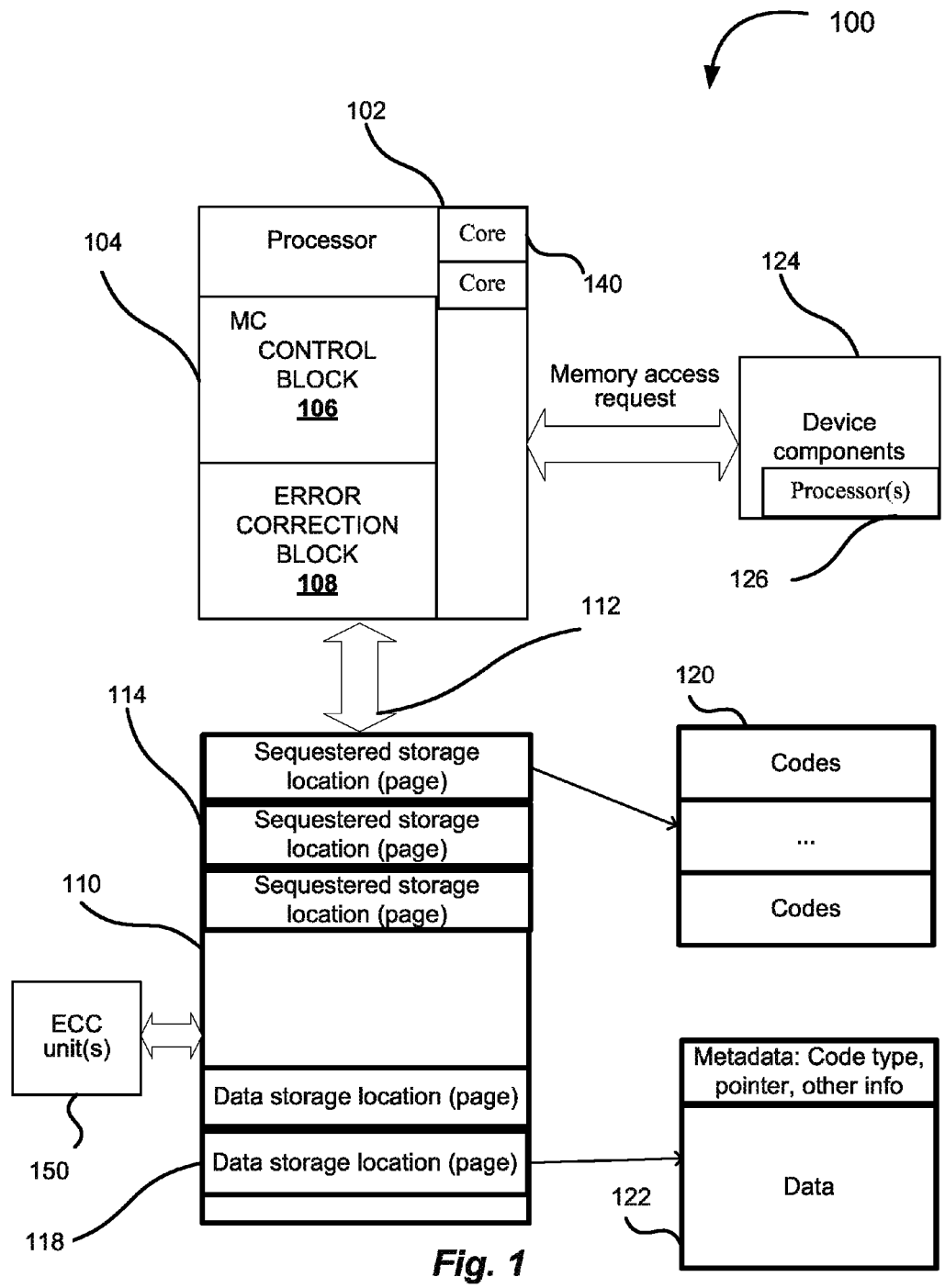
FIG. 1 illustrates an example environment (e.g., computing system) in which selective provision of error correction to non-volatile memory may be implemented in accordance with various embodiments.

Market segments involved in manufacturing laptops, tablet computer, and the like may have loose requirements on memory reliability levels. However, memory technology improvements in capacity, power efficiency and performance may come at a cost of increased susceptibility to multi-bit faults that may be caused by hard faults (e.g., persistent errors to the software such as content caused by the hardware), and wear-out. The growing fault rate of memories may be such as to affect those market segments that in the past have not required RAS support. Existing correction codes may not suffice to help attain desired reliability, such as desired failure-in-time (FIT) levels, and existing RAS solutions may have over-reaching capacity for error correction and may be costly.

Embodiments of the present disclosure may be based on the assumption that most multi-bit errors uncorrectable by common error correction codes may be clustered in few memory units (e.g., memory pages) and may be predicted based on the occurrence of previous single-bit faults. More specifically, multi-bit errors may be predicted based on previous errors in the memory system. The probability of a random multi-bit error may be small, while the probability that a multi-bit error may arise after a previously-occurred hard fault may be considerable relative to the probability of the random error. This assumption may allow for avoiding over-reaching and costly RAS solutions. Instead, the proposed memory protection techniques provide for dynamic and selective protection of data stored in the memory. For example, some memory pages may be protected with regular single error correction double error detection (SECDED) codes, whereas others may be protected with DECTED or other, stronger error correction codes, depending on a predicted strength of the error correction codes that may be required. Accordingly, the disclosed techniques may provide for adaptive strength of the error correction codes, which may be increased upon the occurrence of errors, e.g., caused by hard faults lying within the correction limits of the associated codes (e.g., one error for SECDED codes, two errors for DECTED codes, and so forth). The occurrence of a hard fault may be used as a predictive indicator of a possible future uncorrectable multi-bit error.

Accordingly, apparatuses, methods and storage medium associated with selective provision of error correction to a non-volatile memory are disclosed herein. Techniques described herein may involve providing one or more higher level error correction arrangements to selectively complement a lower level error correction arrangement. A higher level error correction arrangement may be configured to generate error correction codes with increased correction capability, when it is predicted that future additional errors in the non-volatile memory of a device may not be correctable with the error correction codes with lesser error correction capability provided by a lower level error correction arrangement.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Various entities may be introduced and described with respect to the operations they perform. It will be understood that these entities may include hardware, software, and/or firmware elements that are cooperatively configured to provide the described operations.

FIG. 1 illustrates an example computing environment (e.g., a computing system) in which units of memory to be protected are selected in a heterogeneous way based on occurrence of hard faults in accordance with various embodiments. With reference to FIG. 1, in various embodiments, a system 100 may include memory 110, in some embodiments non-volatile memory, a processor 102 including a memory controller (MC) 104, and one or more device components 124, coupled with each other as shown. MC 104 may be configured to selectively provide error correction to non-volatile memory 110. In embodiments, non-volatile memory 110 may be configured with an error correction arrangement with the capability of correcting a small number of errors, e.g., single-bit errors. MC 104, on other hand, may be configured with another error correction arrangement with the capability correcting more number of errors, e.g., 2 or more bits, e.g., multi-bit errors. Further, MC 104 may be configured to selectively employ its error correction arrangement to complement the error correction arrangement of memory 110. In embodiments, MC 104 may be configured to employ its error correction arrangement to complement that of non-volatile memory 110 when non-volatile memory 110 corrects one or more errors during a data read, and will not be able further correct another error if encountered in another subsequent read. The term "arrangement" as used herein refers to the hardware/software elements configured to provide error correction in accordance with an error correction scheme, e.g., single error correction, double error detection (SECDED).

As shown, the processor 102 may include one or more processing units (e.g., cores) 140 and the MC 104 including a control block 106 and an error correction block 108. Control block 106 may be configured to manage accesses to non-volatile memory 110, for example, process access requests from the device components 124 that may be operated by processor(s) 126. Error correction block 108 may be configured to adaptively provide error correction to data read from non-volatile memory 110. For the illustrated embodiments, non-volatile memory 110 may be configured with, and support, error correction capability, e.g. error correction code (ECC) unit or ECC devices 150, to store (and potentially generate) error correction codes (hereinafter, simply code) for data stored. In some embodiments, block 150 may be partially implemented in the non-volatile memory 110 and in the MC 104 (e.g., logic to generate codes, detect and correct errors). Typically, the error correction capability of ECC unit 150 is lower than the capability provided by error correction block 108. For these embodiments, error correction block 108 may be configured to selectively provide its error correction capability of higher capability, to complement the lower capability error correction provided by ECC unit 150 of non-volatile memory 110, to be described more fully below. From the description to follow, it will be apparent that control block 106 and/or error correction block 108 may be implemented with any combination/arrangement of hardware and software. The configuration shown in FIG. 1 is just one non-limiting example. In other embodiments, control block 106 and/or error correction block 108 may be separate from memory controller 104 and/or each other.

Memory 110 may be, in some embodiments, any non-volatile memory that may lose charge over time or suffer from other defects or wear-out phenomena, thus incurring errors. For example, the non-volatile memory 110 may include but not limited to NAND (flash) memory, ferroelectric random-access memory (FeTRAM), nanowire-based non-volatile memory, memory that incorporates memristor technology, a static random access memory (SRAM), three dimensional (3D) cross point memory such as phase change memory (PCM), spin-transfer torque memory (STT-RAM), and the like.

In various embodiments, the MC 104 may sequester (e.g., allocate and isolate from) non-volatile memory 110 one or more storage locations (e.g., pages) 114 to store error correction codes generated by error correction block 108, as shown by the expanded view 120 of the sequestered storage locations 114. In some embodiments, the sequestered storage locations 114 may be isolated and not visible to an operating system of the computing system 100. For example, particular storage locations (e.g., pages) may be identified as not accessible by the operating system 100 and may be designated for storing error correction codes, as opposed to other storage locations (e.g., data pages) that remain accessible by the operating system 100.

In embodiments, error correction block 108 may be configured to use the other unsequestered storage locations (e.g., pages) 118, generally accessible to others, e.g., an operating system, to store metadata associated with codes 120, as shown in the expanded view 122 of the example storage location 118. The metadata may include, but is not limited to, identifications of sequestered storage locations 114 or their sections, such as pointers to those locations in which the error correction codes generated by error correction block 108 may be stored. The information may further include an error correction code type, and other relevant information, such as other types of error correction and/or detection data, e.g., cyclic redundancy check ("CRC") bits, column/row redundancy data, and so forth to protect the metadata and or data from the data storage location.

In embodiments where memory 110 includes ECC unit or devices 150, MC 104 may be configured to selectively provide its error correction capability in response to the detection and/or correction of an error by ECC unit 150. For example, MC 104, more specifically error correction block 108, may apply its error correction capability and generate error correction codes that can correct 2 or more bits (e.g., multi-bit errors) in a memory page, in response to ECC unit 150 detecting and correcting a single-bit error in data word from that memory page. In general, MC 104, more specifically error correction block 108, may be configured to generate error correction codes that can correct at least 1 more bit of error than the number of bits of error correctable by the error correction codes of ECC unit 150.

In embodiments, MC 104 may be configured to perform a memory test on system start-up (power on) to trigger an initial error detection and correction of any potential errors in non-volatile memory 110. For example, MC 104 may be configured to perform read/write accesses to non-volatile memory 110 to trigger ECC unit 150 to detect errors in non-volatile memory 110, as well as generate and store error correction codes for the test/initialization data stored. The MC 104 (e.g., error correction block 108) may selectively generate error correction codes with high error correction capabilities for those units of memory (e.g., a page) with detected errors. These and other aspects of the present disclosure of selective provision of error correction to memory will be described below in greater detail with references to FIGS. 2-6.

Figure 2:
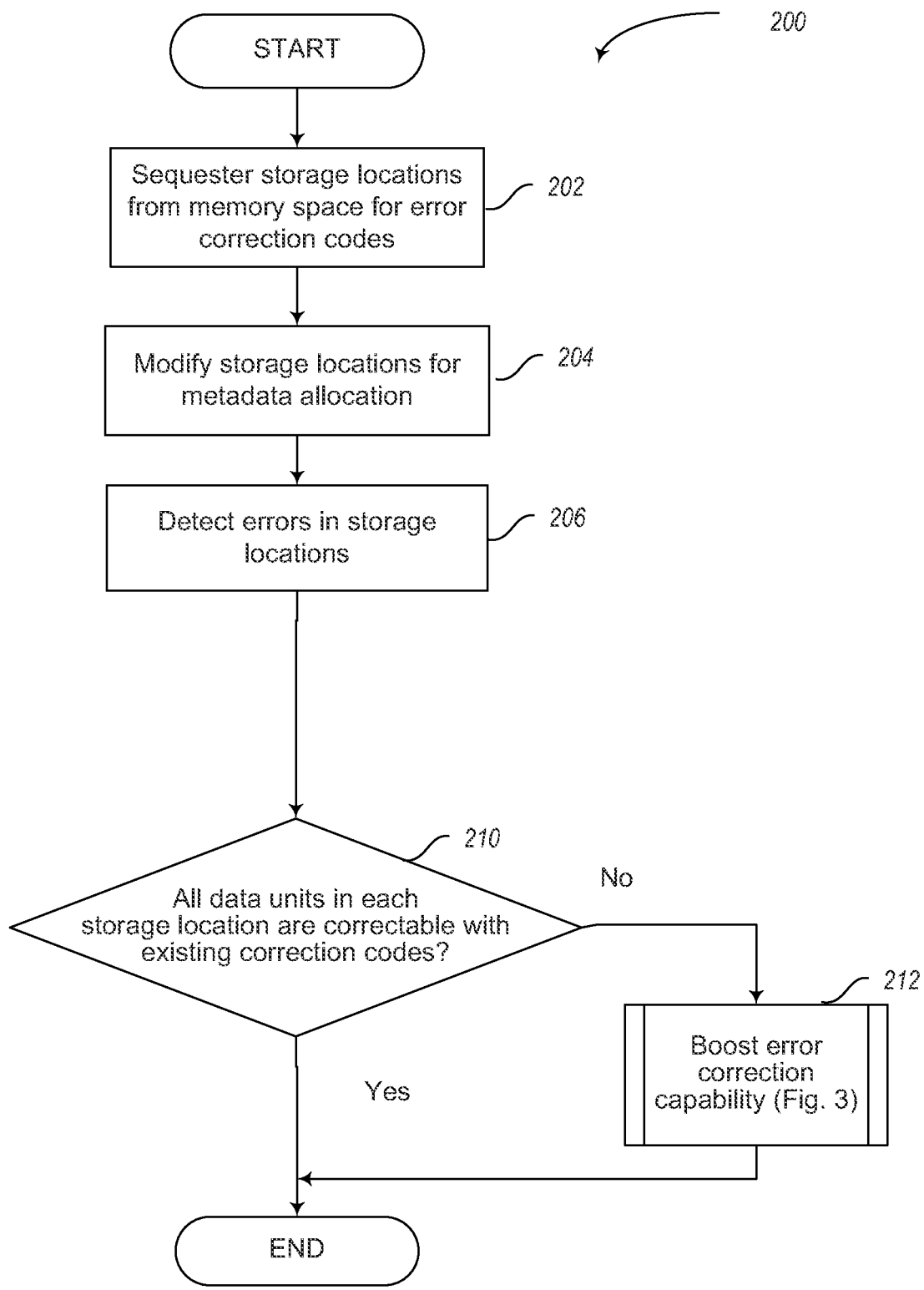
FIG. 2 illustrates an example process flow diagram for initiating the selective provision of error correction to non-volatile memory in accordance with various embodiments.

FIG. 2 is a process flow diagram illustrating some aspects of selective provision of error correction to a non-volatile memory by a MC 104, in accordance with some embodiments of the present disclosure. In embodiments, the process 200 may be performed just once, when the system 100 is being started (e.g., at a power-on).

The process 200 may begin at block 202, where the MC 104 may allocate ("sequester") one or more storage locations in the non-volatile memory for storing error correction codes that will be generated by error correction block 108. At block 204, the MC 104 may further access unsequestered storage locations to store information related to the error correction codes. The information may include, but is not limited to, pointers to the sequestered locations storing the error correction codes, error correction code types, and so forth. In some embodiments, the information may be stored as metadata in the allocated sections of the generally accessible storage locations.

At block 206, the MC 104 may attempt to detect errors in one or more storage locations of non-volatile memory 110. The MC 104 may perform data verification, for example, using an existing built-in self-test function (e.g., part of control block 106) to perform read/write accesses against the storage locations of non-volatile memory 110. The purpose of this memory error detection process may be to identify, for particular storage locations, a number of errors, if encountered during operation, may be beyond the correction limit of the error correction arrangement of non-volatile memory 110, such as error correction codes stored in the ECC devices 150.

At decision block 210, the MC 104 may determine whether errors detected in data units (e.g., data words such 16 or 32 bits) stored in a particular storage location, if encountered during operation, may be correctable by the error correction codes provided by ECC unit 150. A data unit may store a binary string for which an error correction code may be computed. For example, a number of storage locations (e.g., a page) may contain 4 KB of data, but the error correction code may be computed over a smaller amount of data. Accordingly, multiple data units and associated error correction codes may be associated with different ranges of storage locations.

Consider some examples of the error detection performed at block 206. For example, if ECC device 150 of non-volatile memory 110 implements a single error correction—double error detection (SECDED) arrangement and an error is encountered and corrected for data unit during the self-test, an additional (second) error encountered for the data unit during future operation may not be correctable by the memory ECC unit 150.

In another example, if ECC device 150 of non-volatile memory 110 implements a double error correction, triple error detection arrangement (DECTED), and two errors have been encountered and corrected for a particular data unit, a third error of the same unit of memory, if encountered during future operation, may not be correctable by the memory ECC unit 150.

Accordingly, if it is determined that the next level of errors in a unit of memory (e.g., a memory page) may not be correctable by the ECC device 150, the MC 104 (error correction block 108) may generate new error correction codes with increased error correction capabilities. In some embodiments, the MC 104 may perform a "boost error correction capability" routine 212 described below in reference to FIG. 3.

Figure 3:
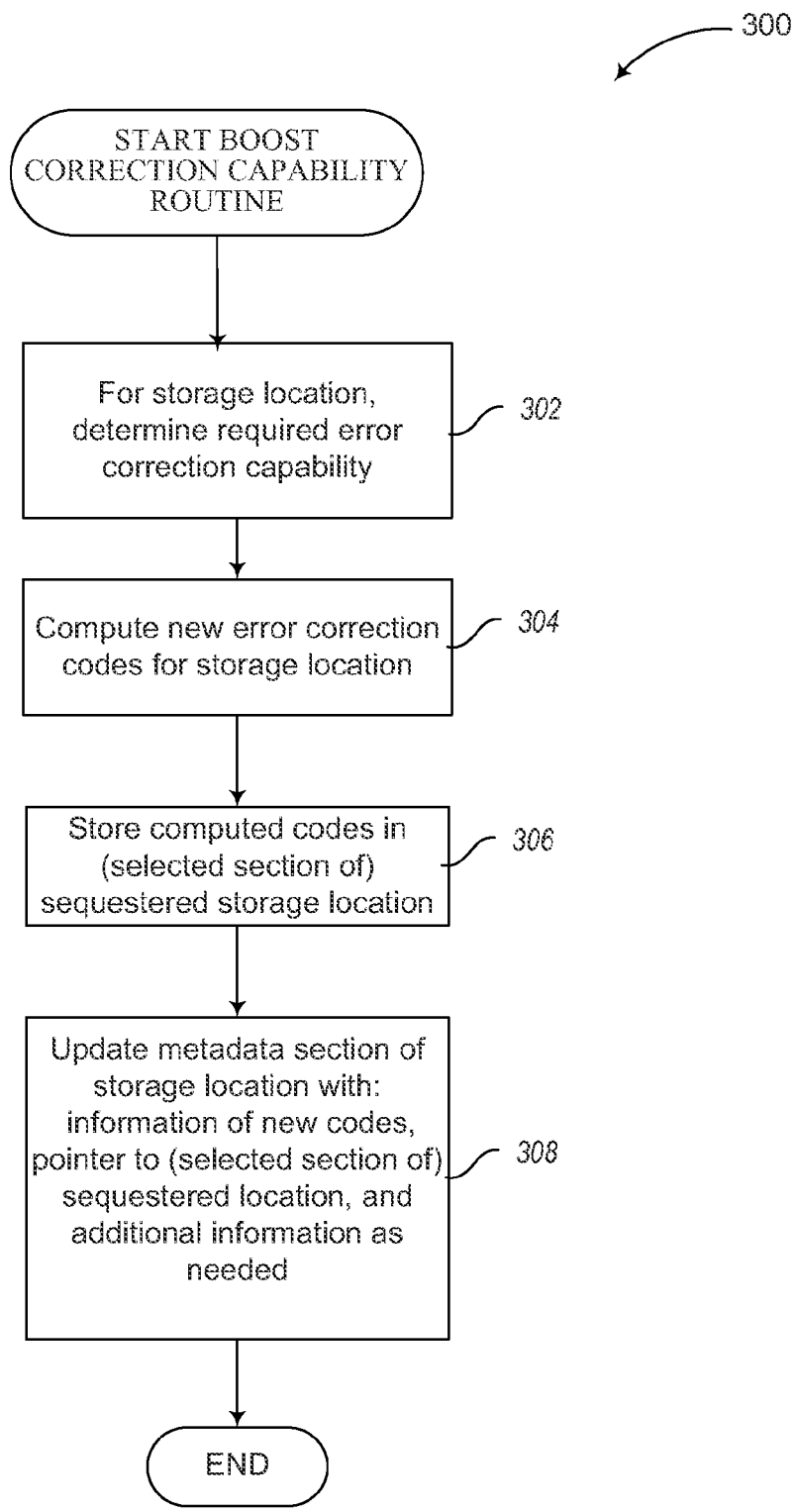
FIG. 3 illustrates an example process flow diagram for boosting error correction capability of a non-volatile memory in accordance with various embodiments.

FIG. 3 is a process flow diagram illustrating a "boost error correction capability routine" in accordance with various embodiments. The routine 300 may begin at block 302, where the MC 104 may determine a next required error correction capability for a particular unit of memory. For example, continuing with examples discussed in reference to block 206 of FIG. 2, if a single error correction—double error detection ECC (SECDED ECC) arrangement is implemented by the ECC unit 150, and a single error has been detected and corrected for a data word, the required correction capability may be increased by at least one bit in order to providing correction for at least an additional detected bit error. Accordingly, the required correction capability provided by error correction block 108 may be DECTED, with error correction capability being one bit more than SECDED.

In case of a double error correction, triple error detection arrangement (DECTED) implemented by the ECC devices 150 and two bit errors have been detected and corrected for a data word, the required correction capability provided by error correction block 108 may be triple error correction (TEC), with error correction capability being one bit more than DECTED. In general, a correction capability of the error correction codes provided by error correction block 108 may exceed the error correction capability of the error correction codes provided by ECC unit 150 by one or more bits, as deemed necessary.

At block 304, the MC 104 (error correction block 108) may compute the new error correction codes for the data words in the failing memory page in accordance with required additional error correction capability as determined at block 302. At block 306, the computed error correction codes may be stored in a selected section of a sequestered storage location. Then, at block 308, MC 104 may update and store the information regarding the codes, such as generating a pointer to the sequestered storage location (or selected section of the sequestered storage location) where the codes are stored, update the code type, and provide other relevant information.

Figure 4:
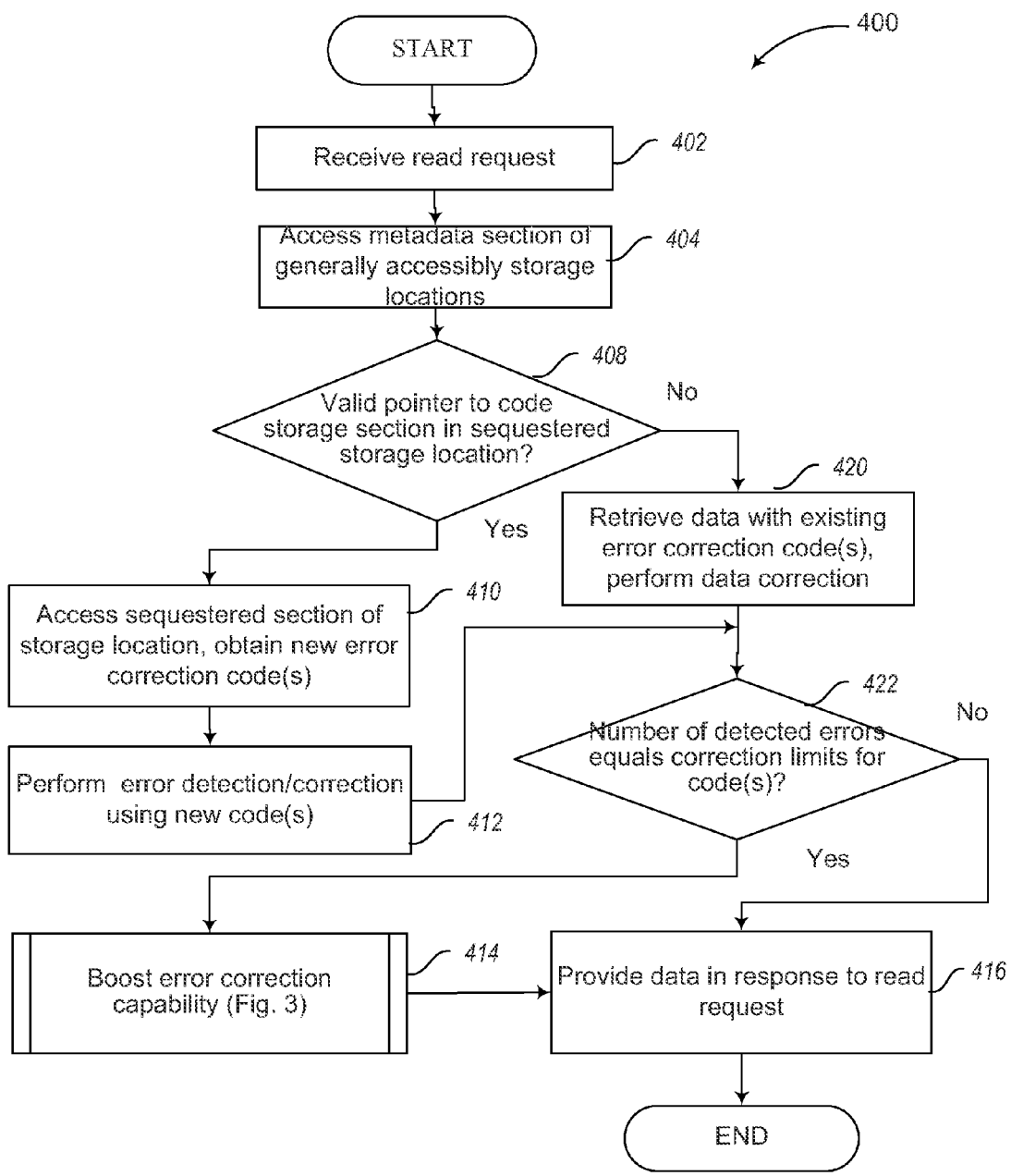
FIG. 4 illustrates an example process flow diagram for processing a read memory access request for a non-volatile memory in accordance with various embodiments.

FIG. 4 is a process flow diagram illustrating a processing of a read memory access request to the non-volatile memory by the MC 104, in accordance with various embodiments. As discussed above, a read request may be provided by a device component 124 illustrated in FIG. 1.

The process 400 may begin at block 402, where the MC 104 may receive a read request from the processor to provide data stored in non-volatile memory 110, for example, in one or more storage locations of a unit of memory (e.g., a page). At block 404, the MC 104 may access the metadata sections of the generally accessible storage locations of non-volatile memory 110 to attempt to determine if error correction codes of higher error correction capability have been previously generated for the requested unit of memory.

At decision block 408, the MC 104, based on the access to the generally accessible storage locations of non-volatile memory 110, may determine whether a valid pointer to a sequestered storage location (or section thereof) is stored for the unit of memory comprising the storage locations of the read access request. If there is not such a pointer, at block 420 the MC 104 may read the requested data from the storage locations, in some embodiments, together with the error correction codes for the requested data from the existing ECC devices 150. The MC 104 may conduct error detection and correction using the existing ECC codes.

If there is a valid pointer in the metadata section, at block 410 the MC 104 may access the sequestered storage location and obtain the associated error correction code(s) with higher error correction capability generated as discussed in reference to FIGS. 2 and 3, and use these higher error correction capability code(s) to detect and correct error or errors encountered for the data read instead. For example, the MC 104 may determine where the associated codes are located within the sequestered storage location (or section thereof). The code addresses may be computed, for example, based on the address provided in the read request and the code type (e.g., DECTED, and so on) indicated in the metadata. The MC 104 may not necessarily obtain all the codes stored in the associated sequestered storage location, but obtain just the codes associated with the unit of memory having the data being read. Accordingly, the MC 104 may retrieve the requested data from the unit of memory with the storage locations containing the data, and also, and request the associated error correction codes (residing in the associated sequestered memory region). At block 412, the MC 104 may perform the data error detection and correction using the codes obtained from the sequestered region and the error correction type (e.g., obtained from the metadata).

At the end of the error detection and correction processes performed at blocks 420 or 412 the number of errors in the read data may be ascertained. At decision block 422 the MC 104 may determine whether the number of detected errors may be covered by the correction capability of the error correction codes used for error detection and correction. If the total number of corrected errors equals the number of correctable errors of the error correction codes used, the MC at block 414 may perform the "boost error correction capability" routine described in reference to FIG. 3, in anticipation of future additional faults in the data word being read The newly generated error correction codes may be stored in the sequestered storage locations associated with the respective data storage locations, as earlier described. Once the error detection and correction is performed, at block 416 the MC 104 may send the data to the system component 124 that originated the read request. Thus, the "boost error correction capability" routine of FIG. 3 may be triggered by read requests whenever the MC 104 find errors in the correction limits, i.e., anticipating that future additional errors in the storage location may not be correctable.

Figure 5:
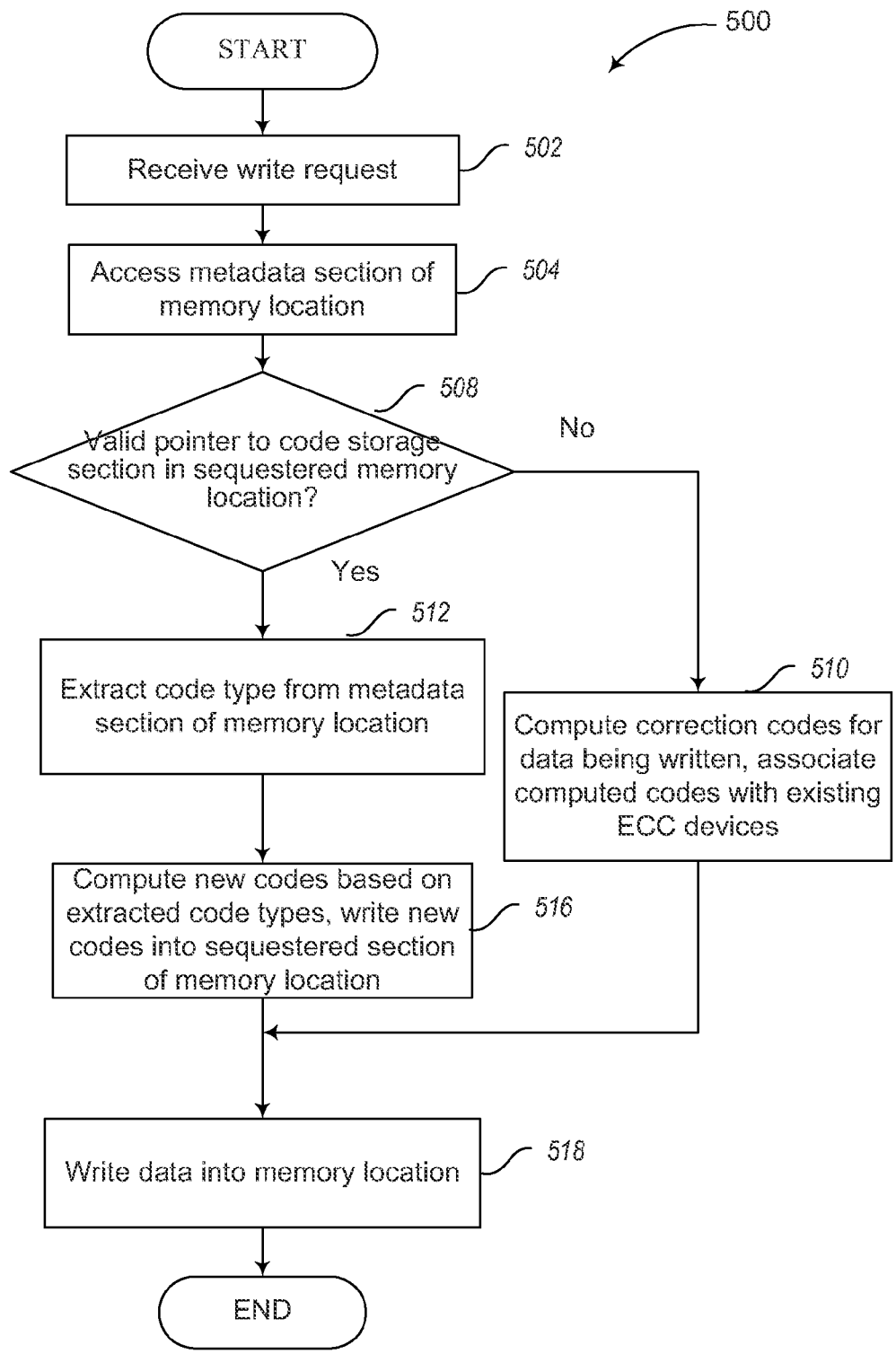
FIG. 5 illustrates an example process flow diagram for processing a write memory access request for a non-volatile memory in accordance with various embodiments.

FIG. 5 is a process flow diagram illustrating the processing of a write memory access request to a non-volatile memory by the MC 104, in accordance with various embodiments. As discussed above, a write request may be requested by a device component 124 illustrated in FIG. 1. The process 500 may begin at block 502, where the MC 104 may receive a write request to write data in one or more storage locations in a unit of memory (e.g., a page). At block 502, the MC 104 may obtain information contained in the metadata section(s) corresponding to the unit of memory having the storage location or locations where the data will be written. As an optimization, in some embodiments, the MC 104 can have some of this information internally cached, e.g., in a cache memory that may provided to the MC 104.

At decision block 508, the MC 104, based on the information obtained, may determine whether there is a valid pointer to a sequestered storage location (or section thereof) having higher capability error correction codes generated for the unit of memory. If there is not such a pointer, at block 510 the MC 104 may write the data into non-volatile memory 110, compute the error correction codes for the unit of memory where the data is being written, and store the computed codes in the ECC devices 150.

If there is a valid pointer, at block 512 the MC 104 may extract from the metadata the type of error correction code used. At block 516, the MC 104 may compute the higher error correction capability codes for the data are being written, based on the data word to be written and the error correction type. Also, at block 516, the MC 104 may write the higher error correction capability codes into an available sequestered storage location (e.g., one identified in the metadata), with the corresponding pointer and associated information written into the metadata section of the memory page (e.g., data page). At block 518, the MC 104 may write the data into the respective storage location or locations of the particular unit of memory.

Figure 6:
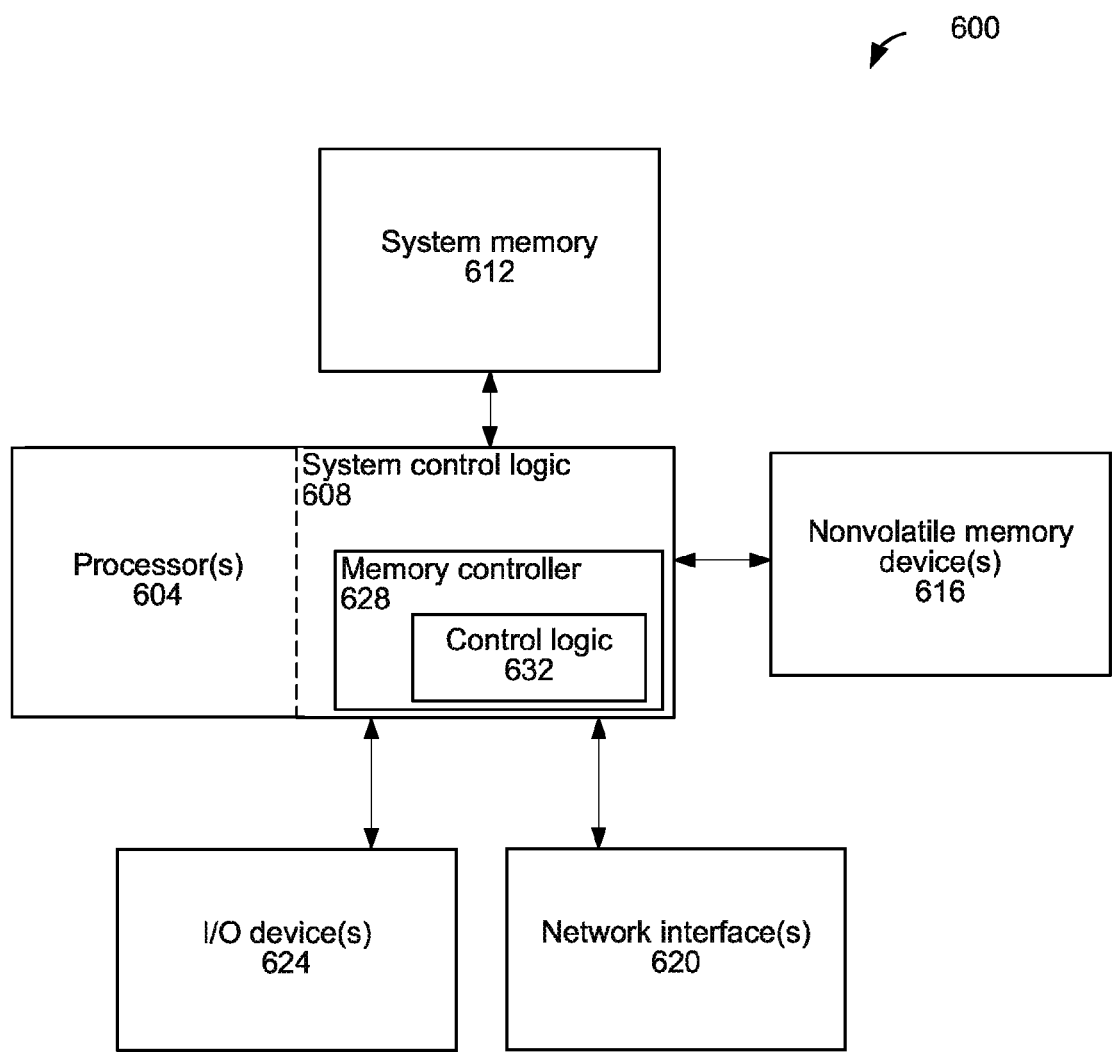
FIG. 6 illustrates a system configured with selective provision of error correction to non-volatile memory in accordance with some embodiments.

FIG. 6 illustrates an example system 600 suitable for implementing aspects of selective provision of error correction to a non-volatile memory described herein in accordance with various embodiments. Embodiments of the present disclosure may be implemented in a system using any suitable hardware and/or software to configure as desired. An example system 600 comprises processor(s) 604, system control logic 608 coupled to, or integrated with, at least one of the processor(s) 604, system memory 612 coupled to system control logic 608, nonvolatile memory device(s) 616 coupled to system control logic 608, network interface(s) 620 coupled to system control logic 608, and input/output device(s) 624 coupled to system control logic 608.

The processor(s) 604 may include one or more single-core or multi-core processors. The processor(s) 604 may include any combination of general-purpose processors and dedicated processors (e.g., graphics processors, application processors, etc.). Applications, operating systems, etc., executing on the processor(s) 604 may issue memory access requests directed to the nonvolatile memory device(s) 616 similar to the device component 124 issuing memory access requests to non-volatile memory 110 described above with respect to FIG. 1.

System control logic 608 for one embodiment may include any suitable interface controllers to provide for any suitable interface to at least one of the processor(s) 604 and/or to any suitable device or component in communication with system control logic 608.

System control logic 608 for one embodiment may include one or more memory controller(s), e.g., memory controller 628, to provide an interface to system memory 612 and nonvolatile memory device(s) 616. In some embodiments, at least some system control logic, such as memory controller, may be implemented (e.g., integrated) directly in the processor(s) 604. System memory 612 may be used to store data and/or instructions, for example, for system 600. System memory 612 for one embodiment may include any suitable volatile memory, such as suitable dynamic random access memory (DRAM), for example. Similar to non-volatile memory 110, non-volatile memory device(s) 616 may include ECC capability, capable of correcting and/or detecting a small number of bit errors, e.g., single bit error.

The nonvolatile memory device(s) 616 may include one or more tangible, non-transitory computer-readable media used to store data and/or instructions, for example. The nonvolatile memory device(s) 616 may include nonvolatile memory that may be implemented in, for example, a solid state drive (SSD). The nonvolatile memory device(s) 616 may further include any suitable nonvolatile storage device(s), such as one or more hard disk drive(s) (HDD(s)), compact disk (CD) drive(s), and/or digital versatile disk (DVD) drive(s), for example.

The nonvolatile memory device(s) 616 may include a storage resource physically part of a device on which the system 600 is installed or it may be accessible by, but not necessarily a part of, the device. For example, a portion of the nonvolatile memory device(s) 616 may be accessed over a network via the network interface(s) 620 and MC 628.

The memory controller 628 may include control logic 632 configured to perform at least some parts of the selective error correction provision to memory described herein, such as, for example, carrying out error detection and correction and based on a result of the error detection and correction by ECC of system memory 612, generating new error correction codes with higher correction capability as earlier described with references to FIGS. 1-5. The control logic 632 may include instructions that are executed by at least one of the processor(s) 604 to perform the described operations or by an internal processing component.

System control logic 608 for one embodiment may include one or more input/output (I/O) controller(s) to provide an interface to network interface(s) 620 and I/O device(s) 624.

Network interface(s) 620 may provide one or more interface(s) for system 600 to communicate over one or more network(s) and/or with any other suitable device. Network interface(s) 620 may include any suitable hardware and/or firmware. Network interface(s) 620 for one embodiment may include, for example, a network adapter, a wireless network adapter, a telephone modem, and/or a wireless modem. For wireless communications, network interface(s) 620 may use one or more antennas. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The network interface(s) 620 may implement any of a number of wireless standards or protocols, including but not limited to Wi-Fi (IEEE 802.11 family), Worldwide Interoperability for Microwave Access (WiMAX, IEEE 802.16 family), IEEE 802.20, long term evolution (LTE), Evolution Data Optimized (Ev-DO), Evolved High-Speed Packet Access (HSPA+), Evolved High-Speed Downlink Packet Access (HSDPA+), Evolved High-Speed Uplink Packet Access (HSUPA+), Enhanced Data rates for GSM Evolution (EDGE), Global System for Mobile Communications (GSM), General Packet Radio Service (GPRS), Code Division Multiple Access (CDMA), Time Division Multiple Access (TDMA), Digital Enhanced Cordless Telecommunications (DECT), Bluetooth®, and derivatives thereof, as well as any other wireless protocols that are designated as 2G, 3G, 6G, 6G, and beyond.

The system 600 may include a plurality of communication chips (not illustrated) for implementing various aspects of network interfacing. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The system 600 may include a display device, such as, for example, a cathode ray tube (CRT), a liquid crystal display (LCD), a light emitting diode (LED), or other suitable display device. The display device may be a touch screen display supporting touch screen features, and in various one of these embodiments, the I/O controller may include a touchscreen controller. In various embodiments, the display device may be a peripheral device interconnected with the system 600.

For one embodiment, at least one of the processor(s) 604 may be packaged together with logic for one or more controller(s) of system control logic 608. For one embodiment, at least one of the processor(s) 604 may be packaged together with logic for one or more controllers of system control logic 608 to form a System in Package (SiP). For one embodiment, at least one of the processor(s) 604 may be integrated on the same die with logic for one or more controller(s) of system control logic 608. For one embodiment, at least one of the processor(s) 604 may be integrated on the same die with logic, e.g., control logic 632, for one or more controller(s), e.g., memory controller 628, of system control logic 608 to form a System on Chip (SoC) package.

The I/O device(s) 624 may include user interfaces designed to enable user interaction with the system 600, peripheral component interfaces designed to enable peripheral component interaction with the system 600, and/or sensors designed to determine environmental conditions and/or location information related to the system 600. In various embodiments, the user interfaces could include, but are not limited to, a display, e.g., a liquid crystal display, a touch screen display, etc., a speaker, a microphone, a still camera, a video camera, a flashlight (e.g., a light emitting diode flash), and a keyboard. For embodiments including a display supporting touch screen features, the system 600 may include a touchscreen controller for facilitating control of the display. In various embodiments, the peripheral component interfaces may include, but are not limited to, a nonvolatile memory port, an audio jack, and a power supply interface. In various embodiments, the sensors may include, but are not limited to, a gyro sensor, an accelerometer, a proximity sensor, an ambient light sensor, and a positioning unit. The positioning unit may also be part of, or interact with, the network interface(s) 620 to communicate with components of a positioning network, e.g., a global positioning system (GPS) satellite.

In various embodiments, the system 600 may be any other electronic device that processes data. In various embodiments, the system 600 may be a computing device such as, but not limited to, a laptop computing device, a tablet computing device, a netbook, a desktop computing device, a smartphone, a mobile phone, a personal digital assistant, an ultra-mobile personal computing device, a server, a printer, a scanner, a monitor, a set-top box, an entertainment control unit, a digital camera, a portable music player, a digital video recorder, etc. In various embodiments, system 600 may have more or fewer components, and/or different architectures.

Referring now to FIG. 1, while for ease of understanding, the present disclosure has been described with non-volatile memory 110 having ECC unit 150 configured with one error correction arrangement, and MC 104 (error correction block 108) configured with another error correction arrangement of higher error correction capability, to be selected employed to complement the error correction arrangement of ECC unit 150. The present disclosure is not so limiting. In embodiments, aspects of the present disclosure, e.g., storing error correction codes in sequestered memory, and pointers to the error correction codes in generally accessible memory, may be practiced, even when non-volatile memory 110 if not equipped with ECC unit 150. For these embodiments, MC 104 may be further configured to detect errors and determine whether an error encountered is a hard fault or soft fault (e.g., a non-persistent error). Such determination may be performed in any one of a number techniques known in the art. Also, the MC 104 may be configured to correct the detected error if this is caused by one or more hard faults. In embodiments, MC 104 may be configured to provide error correction codes for hard faults only, and ignore the soft faults.

According to various embodiments, the present disclosure describes a number of examples. Example 1 is an apparatus for facilitating read or write access of a memory, comprising: a memory controller configured to facilitate read or write access of a memory, the controller configured to provide a first error correction arrangement configured to provide a first level of error correction capability for data stored in the memory and a second error correction arrangement configured to provide a second level of error correction capability for data stored in the memory, the second level of error correction capability enabling correction of at least one bit error more than the first level of error correction capability, and the memory controller configured to selectively employ the second error correction arrangement to complement or replace the first error correction arrangement for some, but not all, storage locations of the memory.

Example 2 may include the subject matter of Example 1, and further specifies that the memory controller is further configured to allocate a subset of the storage locations in the memory to store at least error correction codes of the second error correction arrangement and configure the subset of storage locations to be accessible only to the apparatus.

Example 3 may include the subject matter of Example 2, and further specifies that the memory controller is further configured to generate pointers to the error correction codes of the second error correction arrangement, and store the pointers in other generally accessible storage locations of the memory.

Example 4 may include the subject matter of Example 3, and further specifies that the memory controller is further configured to, in response to a read request to access a unit of data stored in the memory, determine, based at least in part on the pointers, whether error correction is provided by the second error correction arrangement for a group of storage locations comprising the unit of data; and detect and correct one or more errors, if present, in the group of storage locations using an error correction code provided by the second error correction arrangement for the group of storage locations.

Example 5 may include the subject matter of Example 4, and further specifies that the memory controller is further configured to generate an error correction code in accordance with a third error correction arrangement, in response to detection and correction of a threshold number of errors under the second error correction arrangement, and replace the error correction code of the second error correction arrangement with the error correction code of the third error correction arrangement, wherein the third error correction arrangement is configured to provide a third level of error correction capability that exceeds the second level correction capability by at least one bit error.

Example 6 may include the subject matter of Example 4, and further specifies that the memory controller is further configured to, in response to a write request to write a unit of data into one or more storage locations, determine, based on the stored pointers whether the second error correction arrangement is employed for the one or more storage locations associated with the write; and in response to a determination that the second error correction arrangement is employed for the one or more storage locations associated with the write, generate and store a new error correction code for a unit of memory comprising the one or more storage locations associated with the write, under the second error correction arrangement.

Example 7 may include the subject matter of Example 1, and further specifies that the memory controller is configured to generate an error correction code in accordance with the second error correction arrangement for a group of storage locations to provide the second level of error correction capability for the group of storage locations, in response to a detection and correction of one or more errors by the first error correction arrangement.

Example 8 may include the subject matter of Example 7, and further specifies that the detection and correction of one or more errors by the first error correction arrangement is performed in response to a read request to access a unit of data stored in one or more storage locations within the group of storage locations.

Example 9 may include the subject matter of Example 8, and further specifies that the detection and correction of one or more errors by the first error correction arrangement is performed during power on self-test of a computing platform on which the apparatus is disposed.

Example 10 may include the subject matter of Examples 1 to 9, and further specifies that the first and second error correction arrangements are, respectively, "single error correction, double error detection" (SECDED), and "double error correction, triple error detection" (DECTED).

Example 11 may include the subject matter of Example 1, and further specifies that the memory controller is configured to organize the storage locations, and selectively provide the second error correction arrangement on a memory page basis.

Example 12 is at least one computing device-readable storage medium having executable instructions for selective provision of error correction that, in response to execution by a memory controller, cause the memory controller to recognize an error correction performed to correct one or more errors for one or more storage locations of a memory by a first error correction arrangement of the memory, wherein the first error correction arrangement has a first level correction capability; determine, in response to the recognition, whether the first level correction capability is sufficient to correct an additional amount of error or errors if subsequently detected for the one or more storage locations; and based on a result of the determination, selectively employ a second correction arrangement with higher error correction capability than the first correction arrangement to provide additional error correction capability to the one or more storage locations.

Example 13 may include the subject matter of Example 12, and further specifies that the instructions further cause the memory controller to allocate a subset of the storage locations in the memory to store error correction codes of the second error correction arrangement and configure the subset of storage locations to be accessible only to the memory controller.

Example 14 may include the subject matter of Example 13, and further specifies that the instructions further cause the memory controller to generate pointers to a location of the error correction codes of the second error correction arrangement, and store the pointers in other generally accessible storage locations of the memory.

Example 15 may include the subject matter of Example 14, and further specifies that the instructions further cause the memory controller, in response to a read request to access a unit of data stored in the memory, to determine, based at least in part on the pointers, whether error correction is provided by the second error correction arrangement for a group of storage locations comprising the unit of data; and detect and correct one or more errors, if present, in the group of storage locations using an error correction code provided by the second error correction arrangement for the group of storage locations.

Example 16 may include the subject matter of Example 14, and further specifies that the instructions further cause the memory controller, in response to a write request to write a unit of data into one or more storage locations, to determine, based on the stored pointers, whether the second error correction arrangement is employed for the one or more storage locations of the write; and in response to a determination that the second error correction arrangement is employed for the one or more storage locations of the write, generate a new error correction code for a group of storage location comprising the one or more storage locations of the write under the second error correction arrangement.

Example 17 may include the subject matter of any of Examples 12 to 16, and further specifies that the memory is selected from a group including: flash memory, ferroelectric random-access memory (FeTRAM), nanowire-based non-volatile memory, or three-dimensional (3D) cross point memory.

Example 18 is memory controller-implemented method for selective provision of error correction, comprising: recognizing an error correction performed to correct one or more errors for one or more storage locations of a memory by a first error correction arrangement of the memory, wherein the first error correction arrangement has a first level correction capability; determining, in response to the recognition, whether the first level correction capability is sufficient to correct an additional amount of error or errors if subsequent detected for the one or more storage locations; and based on a result of the determination, selectively employing a second correction arrangement with higher error correction capability than the first correction arrangement to provide additional error correction capability to the one or more storage locations.

Example 19 may include the subject matter of Example 18, and further specifies that the method includes allocating a subset of the storage locations in the memory to store error correction codes of the second error correction arrangement; and configuring the subset of storage locations to be accessible only to the memory controller.

Example 20 may include the subject matter of Example 19, and further specifies that the method includes generating pointers to error correction codes of the second error correction arrangement; and storing the pointers in other generally accessible storage locations of the memory.

Example 21 is memory controller for selective provision of error correction comprising: an interface to couple the memory controller to a memory having a number of storage locations; and a controller coupled to the interface and configured to facilitate read or write access of the memory, via the interface, wherein the controller is configured to provide error correction for data stored in the memory, wherein provision of error correction includes generation of error correction codes for the data, allocation of a subset of the storage locations of the memory to store the error correction codes, and configuration of the subset of storage locations to be accessible only to the memory controller.

Example 22 may include the subject matter of Example 19, and further specifies that the controller is further configured to generate and store pointers to the error correction codes in other generally accessible storage locations of the memory.

Example 23 is an apparatus for selective provision of error correction, comprising: means for facilitating read or write access of a memory, the means configured to provide a first error correction arrangement configured to provide a first level of error correction capability for data stored in the memory and a second error correction arrangement configured to provide a second level of error correction capability for data stored in the memory, the second level of error correction capability enabling correction of at least one bit error more than the first level of error correction capability, and the means configured to selectively employ the second error correction arrangement to complement or replace the first error correction arrangement for some, but not all, storage locations of the memory.

Example 24 may include the subject matter of Example 23, and further specifies that the apparatus further includes means for allocating a subset of the storage locations in the memory to store at least error correction codes of the second error correction arrangement; and means for configuring the subset of storage locations to be accessible only to the memory controller.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein, limited only by the claims.

What is claimed is:

1. An apparatus comprising:
a memory controller to facilitate read or write access of a non-volatile memory, the controller to provide a first error correction arrangement configured to provide a first level of error correction capability for data stored in the memory and a second error correction arrangement configured to provide a second level of error correction capability for data stored in the non-volatile memory, the second level of error correction capability enabling correction of at least one bit error more than the first level of error correction capability, and the memory controller to selectively employ the second error correction arrangement to complement or replace the first error correction arrangement for some, but not all, storage locations of the non-volatile memory, wherein the memory controller is further, in response to a read request to access a unit of data stored in the non-volatile memory, to detect and correct one or more errors, if present, in the group of storage locations using an error correction code provided by the second error correction arrangement; and, in response to detection and correction of a threshold number of errors under the second error correction arrangement, generate an error correction code in accordance with a third error correction arrangement; and replace the error correction code of the second error correction arrangement with the error correction code of the third correction arrangement.

2. The apparatus of claim 1, wherein the memory controller is further to allocate a subset of the storage locations in the memory to store the error correction codes of the second error correction arrangement and configure the subset of storage locations to be accessible only to the apparatus.

3. The apparatus of claim 2, wherein the memory controller is further to generate pointers to the error correction codes of the second error correction arrangement, and store the pointers in other generally accessible storage locations of the non-volatile memory.

4. The apparatus of claim 3, wherein the memory controller is further to, in response to the read request to access the unit of data stored in the non-volatile memory:
determine, based at least in part on the pointers, whether error correction is provided by the second error correction arrangement for a group of storage locations comprising the unit of data.

5. The apparatus of claim 1,
wherein the third error correction arrangement is to provide a third level of error correction capability that exceeds the second level correction capability by at least one bit error.

6. The apparatus of claim 4, wherein the memory controller is further to, in response to a write request to write a unit of data into one or more storage locations:

determine, based on the stored pointers whether the second error correction arrangement is employed for the one or more storage locations associated with the write; and in response to a determination that the second error correction arrangement is employed for the one or more storage locations associated with the write, generate and store a new error correction code for a unit of memory comprising the one or more storage locations associated with the write, under the second error correction arrangement.

7. The apparatus of claim 1, wherein the memory controller is to generate an error correction code in accordance with the second error correction arrangement for a group of storage locations to provide the second level of error correction capability for the group of storage locations, in response to a detection and correction of one or more errors by the first error correction arrangement.

8. The apparatus of claim 7, wherein the detection and correction of one or more errors by the first error correction arrangement is performed in response to a read request to access a unit of data stored in one or more storage locations within the group of storage locations.

9. The apparatus of claim 8, wherein the detection and correction of one or more errors by the first error correction arrangement is performed during power on self-test of a computing platform on which the apparatus is disposed.

10. The apparatus of claim 1, wherein the first and second error correction arrangements are, respectively, "single error correction, double error detection" (SECDED), and "double error correction, triple error detection" (DECTED).

11. The apparatus of claim 1, wherein the memory controller is to organize the storage locations, and selectively provide the second error correction arrangement on a memory page basis.

12. At least one non-transitory computing device-readable storage medium having executable instructions that, in response to execution by a memory controller, cause the memory controller to:

recognize an error correction performed to correct one or more errors for one or more storage locations of a non-volatile memory by a first error correction arrangement of the memory, wherein the first error correction arrangement has a first level correction capability;

determine, in response to the recognition, whether the first level correction capability is sufficient to correct an additional amount of error or errors if subsequently detected for the one or more storage locations;

based on a result of the determination, selectively employ a second correction arrangement with higher error correction capability than the first correction arrangement to provide additional error correction capability to the one or more storage locations;

in response to a read request to access a unit of data stored in the non-volatile memory, detect and correct one or more errors, if present, in the group of storage locations using an error correction code provided by the second error correction arrangement; and in response to detection and correction of a threshold number of errors under the second error correction arrangement, generate an error correction code in accordance with a third error correction arrangement, and replace the error correction code of the second error correction arrangement with the error correction code of the third correction arrangement.

13. The non-transitory computing device-readable storage medium of claim 12, wherein the instructions further cause the memory controller to allocate a subset of the storage locations in the non-volatile memory to store the error correction codes of the second error correction arrangement and configure the subset of storage locations to be accessible only to the memory controller.

14. The non-transitory computing device-readable storage medium of claim 13, wherein the instructions further cause the memory controller to:

generate pointers to a location of the error correction codes of the second error correction arrangement, and store the pointers in other generally accessible storage locations of the non-volatile memory.

15. The non-transitory computing device-readable storage medium of claim 14, wherein the instructions further cause the memory controller, in response to the read request to access the unit of data stored in the non-volatile memory, to determine, based at least in part on the pointers, whether error correction is provided by the second error correction arrangement for a group of storage locations comprising the unit of data.

16. The non-transitory computing device-readable storage medium of claim 14 wherein the instructions further cause the memory controller, in response to a write request to write a unit of data into one or more storage locations, to determine, based on the stored pointers, whether the second error correction arrangement is employed for the one or more storage locations of the write; and in response to a determination that the second error correction arrangement is employed for the one or more storage locations of the write, generate a new error correction code for a group of storage location comprising the one or more storage locations of the write under the second error correction arrangement.

17. The non-transitory computing device-readable storage medium of claim 12, wherein the non-volatile memory is selected from a group including: flash memory, ferroelectric random-access memory (FeTRAM), nanowire-based non-volatile memory, or three-dimensional (3D) cross point memory.

18. A memory controller-implemented method, comprising:

recognizing, with a memory controller, an error correction performed to correct one or more errors for one or more storage locations of a non-volatile memory by a first error correction arrangement of the non-volatile memory, wherein the first error correction arrangement has a first level correction capability;

determining, by the memory controller, in response to the recognition, whether the first level correction capability is sufficient to correct an additional amount of error or errors if subsequently detected for the one or more storage locations;

based on a result of the determination, selectively employing, by the memory controller, a second correction arrangement with higher error correction capability than the first correction arrangement to provide additional error correction capability to the one or more storage locations;

detecting and correcting, by the memory controller, one or more errors, if present, in the group of storage locations using an error correction code provided by the second error correction arrangement; and in response to detecting and correcting a threshold number of errors under the second error correction arrangement, generating, by the memory controller, an error correction code in accordance with a third error correction arrangement, and replacing, by the memory controller, the error correction code of the second error correction arrangement with the error correction code of the third correction arrangement.

19. The memory controller-implemented method of claim 18, further comprising:
   allocating, by the memory controller, a subset of the storage locations in the non-volatile memory to store the error correction codes of the second error correction arrangement; and
   configuring, by the memory controller, the subset of storage locations to be accessible only to the controller.

20. The memory controller-implemented method of claim 19, further comprising:
   generating, by the memory controller, pointers to error correction codes of the second error correction arrangement; and
   storing, by the memory controller, the pointers in other generally accessible storage locations of the non-volatile memory.

21. An apparatus comprising:
   a memory controller to facilitate read or write access of a non-volatile memory, wherein the memory controller is configured to provide error correction for data stored in the non-volatile memory, wherein provision of error correction includes generation of error correction codes for the data, allocation of a subset of the storage locations of the non-volatile memory to store the error correction codes, and configuration of the subset of storage locations to be accessible only to the memory controller, wherein generation of error correction codes includes generation of first error correction code according to a first error correction arrangement and second error correction code according to a second error correction arrangement that enables error correction capability of at least one bit error more than the first error correction arrangement, and, in response to detection and correction of a threshold number of errors under the second error correction arrangement, generation of a third error correction code in accordance with a third error correction arrangement, and replacement of the second error correction code of the second error correction arrangement with the third error correction code of the third correction arrangement.

22. The apparatus of claim 21, wherein the memory controller is further to generate and store pointers to the error correction codes in other generally accessible storage locations of the non-volatile memory.

23. The apparatus of claim 21, wherein the detection and correction of a threshold number of errors under the second error correction arrangement, generation of a third error correction code in accordance with a third error correction arrangement, and replacement of the second error correction code of the second error correction arrangement with the third error correction code of the third correction arrangement occurs in response to a read request to access a unit of data stored in the non-volatile memory.

* * * * *